United States Patent [19]

Lifshitz et al.

[11] Patent Number: 5,166,091
[45] Date of Patent: Nov. 24, 1992

[54] FABRICATION METHOD IN VERTICAL INTEGRATION

[75] Inventors: Nadia Lifshitz, Bridgewater, N.J.; Ronald J. Schutz, Austin, Tex.

[73] Assignee: AT&T Bell Laboratories, Murray Hill, N.J.

[21] Appl. No.: 708,970

[22] Filed: May 31, 1991

[51] Int. Cl.$^5$ .......................... H01L 21/302
[52] U.S. Cl. .................... 437/61; 437/41; 437/59; 437/915; 148/DIG. 53; 148/DIG. 122
[58] Field of Search .......... 437/61, 62, 56, 57, 437/58, 59, 915, 913, 40, 41; 357/23.7

[56] References Cited

U.S. PATENT DOCUMENTS

| | | | |
|---|---|---|---|
| 4,603,468 | 8/1986 | Lam | 437/58 |
| 4,628,589 | 12/1986 | Sundaresan | 437/915 |
| 4,630,089 | 12/1986 | Sasaki et al. | 357/23.7 |
| 4,651,408 | 3/1987 | MacElwee et al. | 437/913 |
| 4,656,731 | 4/1987 | Lam et al. | 437/57 |
| 4,980,308 | 12/1990 | Hayashi et al. | 437/62 |
| 5,021,850 | 6/1991 | Tanaka et al. | 357/23.7 |

FOREIGN PATENT DOCUMENTS

| | | | |
|---|---|---|---|
| 0189676 | 10/1984 | Japan | 357/23.7 |
| 0153854 | 6/1988 | Japan | 437/56 |
| 0246863 | 10/1989 | Japan | 437/56 |

OTHER PUBLICATIONS

Hseih et al., *IEEE Trans. Electron Devices*, 35, pp. 1842, 1988.
Chen et al., *IEDM Technical Digest*, p. 829 (1990).
Yamanake et al., *IEDM Technical Digest*, p. 48 (1988).

*Primary Examiner*—Brian E. Hearn
*Assistant Examiner*—Michael Trinh
*Attorney, Agent, or Firm*—B. S. Schneider

[57] ABSTRACT

In some circuitry, field effect transistors are produced by employing polycrystalline conductive regions including the channel and connections to the source and drain. Conventional methods for producing such transistors involve depositing a thin polycrystalline channel region, patterning this region overlying the patterned region with an insulator, producing openings in the insulator for contacts to source and drain, and depositing a thick polycrystalline contact region. Processing complexity is, however, substantially reduced by first forming interconnect areas, source region and drain regions; then opening a region for the channel; and finally depositing a layer to form the channel. Thus, at least three processing steps are eliminated and vertical dimensions are reduced.

6 Claims, 1 Drawing Sheet

FABRICATION METHOD IN VERTICAL INTEGRATION

BACKGROUND OF THE INVENTION

1. Field of the Invention

This invention relates to the manufacture of integrated circuits and in particular to the manufacture of integrated circuits having transistors with polycrystalline channels.

2. Art Background

Substantial miniaturization has occurred in the production of integrated circuits over the last decade. A variety of approaches are being employed to further effect this miniaturization. One approach involves stacking transistors vertically so that fewer transistors per circuit element are formed in the single crystal substrate and thus higher overall device density is achieved.

In any vertical assemblage of transistors, the underlying transistors, those formed in single crystal silicon, are fabricated by employing the highly defect-free silicon substrate for critical electrical regions such as the channel. Overlying transistors are produced by depositing polycrystalline semiconductor device layers on an insulating region formed on the transistors of the substrate. Since these overlying transistors are produced on an electrically insulating material, in the absence of substantial processing complications they are typically formed in polycrystalline materials. For example, as shown in FIG. 1 for an inverted configuration as used in static random access memory, a polycrystalline region is deposited on silicon oxide separating the overlying from underlying transistors and patterned to form the gate, 12, of the overlying transistors. An inverted configuration involves a transistor with gate region 12 closer to the substrate than channel region 9. A gate oxide region 53 is formed and suitably patterned. A second polycrystalline layer, 9, is deposited to form the channel and appropriately patterned. This layer should be thin to avoid excessive off-state current. Appropriate regions of this layer are heavily doped by ion implantation to form source and drain regions 10 and 11. A third oxide region, 5, is formed to electrically isolate subsequent electrical contacts from the channel and patterned to allow contact to source and drain regions 10 and 11. A third polycrystalline region, 4, is then deposited, doped and patterned to form these source and drain contacts. This additional layer is required to avoid excessive resistance in runners and contacts to the unaugmented channel layer.

This fabrication sequence involves the expense and complications of a large number of steps. This shortcoming is thought necessary to insure a thin channel region 9 and a relatively thick source contact, drain contact and interconnect regions. As mentioned above, the channel region should be thin so that excessive off-state current is not obtained, while the source contact, drain contact and interconnect region 4 is thick to avoid excessive resistance in the source and drain contacts and interconnects. Thus limitations on geometry and electrical properties have strongly influenced the fabrication procedure. (It should be noted that this exemplary description is in terms of an inverted transistor. However, an equivalent description and formation is possible where the gate is instead formed overlying the channel region 9, i.e., an upright configuration.)

Since the overlying transistors are fabricated in polycrystalline material, they are of significantly poorer quality than their underlying counterparts. However, there are many circuits where some parameters of the transistor, i.e., the on-current, for a substantial portion of the active devices is not demanding. For example, in inverter circuits, generally the p-channel device has substantially relaxed electrical requirements compared to their n-channel counterparts used in Complementary Metal Oxide Semiconductor (CMOS) configurations. Typically, in demanding circuits the n-channel current in the on-state relative to the off-state should be $10^{10}$ to $10^{12}$ times larger. In comparison, for an inverter the current in the on-state for the p-channel device need only be $10^3$ to $10^5$ times higher.

Nevertheless, as discussed, to maintain even these relaxed electrical properties in a vertical configuration, material processing complexity arises. The complications attendant this vertical processing reduce its attractiveness as compared to the conventional method of increasing device density by decreasing device size without vertical stacking. If processing complications could be reduced in a vertical configuration, such geometry would become substantially more attractive.

SUMMARY OF THE INVENTION

Vertical stacked devices with appropriate electrical properties are obtainable by employing a process which involves substantially less processing complications than those previously employed. For example, in the inverted configuration after the gate, 2 in FIG. 2, is formed together with the gate oxide 12, the contacts to the source and drain and source and drain themselves are formed by depositing a thick polycrystalline region 24 doping and patterning this region to produce openings for a channel. A second, thin polycrystalline region, 23, e.g., a silicon region, is then deposited and patterned. The thick polycrystalline region 24 provides a low resistance interconnects, as well as low resistance to the source and drain while the polycrystalline region 23 provides a thin channel that is necessary to attain low current for the transistors in their off state. By using this processing sequence, deposition of oxide region 5 in FIG. 1 is avoided, window lithography for contacts to source and drain regions is avoided, and window etching (with a very thin layer of polysilicon 3 as the etch-stop) is eliminated. Additionally, vertical dimensions are substantially decreased, while the degree of nonplanarity is reduced. The consequence of this reduction is a substantial simplification in etching and the filling of contact windows from higher levels to the substrate and, also, a substantial reduction of focusing difficulties in the lithography employed in subsequent processing. In a preferred embodiment, the etching of polycrystalline region 24 to oxide region 12 is performed by first depositing a region of silicon nitride on the gate oxide region 12 before deposition of polycrystalline silicon region 24. Subsequent etching of polycrystalline region 24 to open the channel region using, for example, an HBr and/or chlorine plasma, avoids damage to the oxide region 12, since etching is stopped by the underlying silicon nitride region. This silicon nitride in the channel, if desired, is easily removed by hot phosphoric acid before polycrystalline region 23 deposition.

BRIEF DESCRIPTION OF THE DRAWING(S)

DETAILED DESCRIPTION

The invention, for pedagogic reasons, will be described in terms of the inverted transistor configurations shown in FIG. 2. However, the method is equally applicable to a circuit formed only in polycrystalline silicon without underlying transistors found in single crystal silicon or to a conventional upright transistor configuration by forming a gate region on the gate oxide overlying channel region 23. The formation of a gate region overlying the polycrystalline channel region 23 is accomplished by conventional processing such as described in B. C. Hseih et al, *IEEE Trans. Electron Devices* 35, 1842 (1988). Additionally, the formation of the high quality transistor, e.g., the n-channel transistor for CMOS technology, is performed by conventional processing such as described in M. L. Chen et al., *IEDM Technical Digest*, 829 (1990).

After the underlying transistors are formed utilizing the high quality single crystal material, e.g., substrate material, they are isolated from subsequently fabricated overlying transistors utilizing an insulating region 30 in FIG. 2. (The high quality substrate is generally silicon, but the invention does not preclude use of other substrate materials. For purposes of this invention the underlying transistors, if desired, include electrical contacts made to their active regions.) The separation insulator, e.g., a silicon dioxide region, is easily formed through conventional techniques such as chemical vapor deposition using a tetraethylortho silicate precursor.

Figure 1:
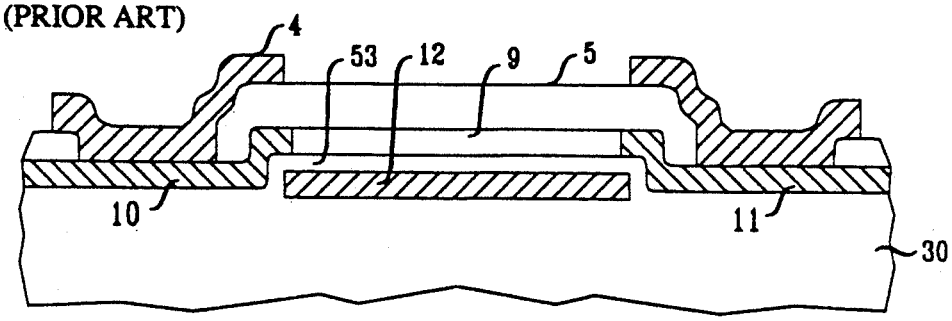
FIG. 1 is illustrative of a vertical transistor configuration.
Figure 2:
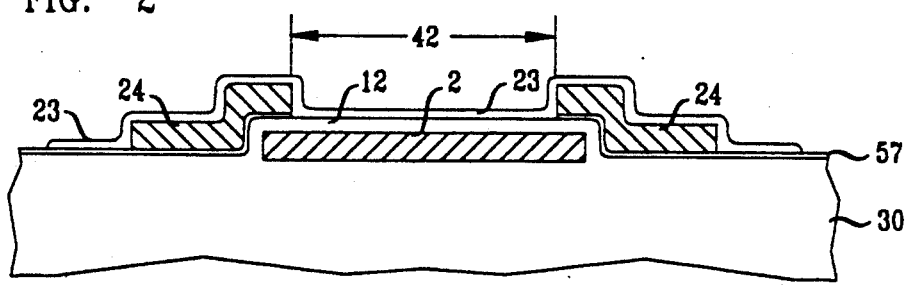
FIGS. 2 and 3 are illustrative of configurations associated with the invention.

For the inverted overlying transistors, the gate, 2 in FIG. 2, is formed by depositing a layer of conductive material, e.g., a layer of polycrystalline silicon, and patterning this region to form the gates. Typically, the gates should have a thickness of approximately 500 to 2000 Å, and sheet resistance of 20 to 500 ohm/□. The gate is then separated from the channel utilizing a gate insulator region 12 in FIG. 2. This gate insulator region, e.g., gate oxide region, should typically have a thickness in the range 100 to 1000 Å. Generally, the region is formed by 1) chemical vapor deposition with a tetraethylortho silicate or silane precursor, or 2) by oxidation of the gate material if the heat required does not in the particular configuration unacceptably affect device structures.

Figure 3:
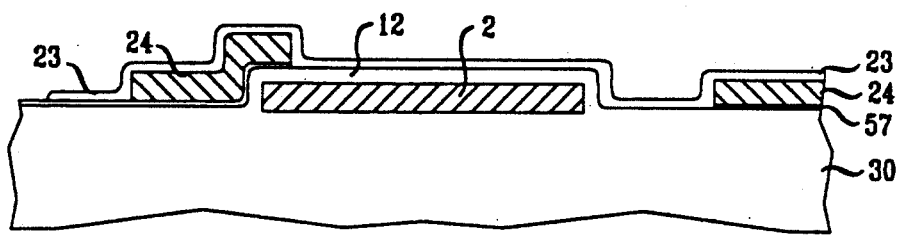

A relatively high conductivity region 24, e.g., a thick, doped polycrystalline silicon region, is then formed by conventional techniques such as LPCVD using a silane precursor followed by dopant implantation after region formation. This region should generally have a thickness in the range 800 to 1500 Å. Thinner regions for materials such as polycrystalline silicon are susceptible to etch through during subsequent processing, such as contact window etching, and have high resistivity, while thicker regions are not precluded but produce excessive vertical dimensions with associated difficulties. The thick contact region, 24 in FIG. 2, is then patterned to provide openings at 42 FIG. 2 for subsequent channel formation and to provide regions for electrical connections through runners. Typical runner configurations are described in T. Yamanake et al, *IEDM Technical Digest*, 48 (1988). The gate is either positioned relative to the channel in a conventional manner or is offset as shown in FIG. 3 away from the drain by using an appropriate lithographic mask. This latter configuration advantageously decreases off-current at the expense of a decrease in on-current. However, such cost in a p-MOS load transistors is generally acceptable.

The channel typically should have a lateral dimension in the range 0.5 to 1.5 $\mu$m. Channels having dimensions greater than 1.5 $\mu$m are undesirable because they occupy excessive area, while channels having a dimension smaller than 0.5 $\mu$m are not suitable because they generally lead to undesirable off-currents. Conventional lithographic techniques in conjunction with conventional plasma etching, e.g., use of a HBr and/or chlorine plasma for patterning polysilicon are described in D. L. Flamm and V. M. Donnelly, *Plasma Chemistry and Plasma Processing* 1 317 (1981).

A relatively thin layer of a semiconducting material is then deposited to form the channel region. The thickness of this material should typically be in the range 100 to 400 Å. A thickness less than 100 Å is difficult to maintain pinhole free, while a thickness greater than 400 Å leads to increased off-currents. The channel material, 23 in FIG. 2, is then patterned as described in Flamm supra to avoid electrical shorting to other devices of the circuit.

In a preferred embodiment plasma damage to oxide 12 in region 42 during patterning of region 24 is avoided. In one approach, before formation of region 24, an etch barrier layer such as a layer of silicon nitride is deposited. To prevent plasma degradation of the gate oxide region 12, typically this material should be at least 150 Å thick; while to avoid degradation of device geometry, the barrier region should generally be thinner than 400 Å. Patterning of region 24, using for example HBr/chlorine plasma based etching of polycrystalline silicon, proceeds until it reaches the barrier region. This barrier region provides an etch stop and prevents plasma damage of the underlying insulator, e.g., silicon oxide. Before formation of region 23, if desired, the silicon nitride is removed in the channel region 42, for example by hot phosphoric acid etch, in a process which does not produce damage to underlying oxide leaving, however, nitride regions 57. Formation of silicon nitride is accomplished by conventional techniques such as LPCVD using ammonia and diclorosilane precursor.

The following example is illustrative of the conditions employed in the inventive process.

EXAMPLE

A silicon substrate having its major surface in the [100] crystallographic plane was cleaned. A layer of silicon dioxide approximately 3000 Å in thickness was deposited by chemical vapor deposition (CVD) from tetraethylortho silicate at 720° C. and at a pressure of 220 mTorr. (All chemical vapor deposited oxides in this example were formed under these conditions.) A layer of polysilicon approximately 1200 Å in thickness was deposited at 600° C. by CVD utilizing a silane precursor at a pressure of 270 mTorr. This polysilicate region was doped with arsenic by ion implantation using an acceleration energy of 90 KeV and a dose of $3 \times 10^{15}$ cm$^{-2}$. This implantation was done through a 180 Å thick CVD oxide mask which was then removed. The gate level was then patterned using conventional lithography and etched in a plasma. The plasma included 30 mole percent molecular chlorine, 30 mole percent HBr and the remainder inert carrier gas. A total pressure of 100 mTorr with a rf power of 300 watts was employed for the etching.

A 250 Å thick gate oxide was deposited by CVD and densified at 850° C. in an oxygen atmosphere. A 200 Å thick layer of a silicon nitride was deposited at 280° C. from ammonia and dichlorosilane (50/50 mole ratio) at a total pressure of 290 mTorr. A polysilicon layer approximately 1000 Å thick was deposited utilizing a silicon precursor at 600° C. and a pressure of 270 mTorr. The polysilicon was doped with boron by ion implantation employing an acceleration energy of 90 KeV and a dose of $5 \times 10^{15}$ cm$^{-2}$. Implantation was accomplished through a subsequently removed thin oxide mask as described previously for the arsenic implantation.

The last polysilicon layer to be deposited was patterned by conventional techniques to expose the channel region. This exposed region was etched in a chlorine/HBr plasma as described above to the underlying silicon nitride layer. This silicon nitride layer was removed by immersion of the substrate in a hot phosphoric acid etch that removes silicon nitride at a rate of 70 Å/min. A layer of amorphous silicon approximately 250 Å thick was then deposited from silane at 550° C. and a pressure of 490 mTorr. The amorphous polysilicon was annealed first at 600° C. in nitrogen for 15 hours to form a large-grained structure and then slightly oxidized in oxygen at 850° C.

An approximately 5500 Å thick silicon dioxide CVD layer was deposited, patterned by conventional techniques, and etched in Freon®-23 at a pressure of 85 mTorr and a power of 300 watts. The etch mask had openings to form contact windows to the underlying polysilicon. Conventional metallization was then performed.

I claim:

1. A process for fabricating a device having at least one first transistor overlying a second transistor, said process comprising the steps of fabrication said second transistor, forming a region of sufficiently low electrical conduction to electrically isolate said first from said second transistor, and forming said second transistor characterized in that said second transistor is produced by the procedure comprising forming a gate and gate oxide for said second transistor, forming an etch barrier, to protect said gate oxide forming a source and drain region, contacting said source and drain region with a relatively thick region of conducting material, etching said relatively thick region to form contacts to said source and drain using said barrier to prevent damage to said gate oxide, depositing a relatively thin region of conductive material over and contacting said relatively thick region, and forming a channel of said second transistor.

2. The process of claim 1 wherein the gate of said second transistor underlies said channel region.

3. The process of claim 2 wherein said relatively thick region comprises doped polysilicon.

4. The process of claim 1 wherein said relatively thick region comprises doped polysilicon.

5. The process of claim 1 wherein said region of sufficiently low electrical conduction comprises silicon dioxide.

6. The process of claim 1 wherein said first transistor is a field effect transistor.

* * * * *